United States Patent [19]
Jeng

[11] Patent Number: 5,923,074
[45] Date of Patent: Jul. 13, 1999

[54] LOW CAPACITANCE INTERCONNECT STRUCTURE FOR INTEGRATED CIRCUITS USING DECOMPOSED POLYMERS

[75] Inventor: Shin-Puu Jeng, Plano, Tex.

[73] Assignee: Texas Instruments Incorporated, Dallas, Tex.

[21] Appl. No.: 08/758,320

[22] Filed: Dec. 3, 1996

[51] Int. Cl.⁶ .................................................. H01L 29/00
[52] U.S. Cl. ..................... 257/522; 257/506; 257/758; 257/760
[58] Field of Search ............................. 257/522, 506, 257/510, 758, 759, 760; 438/411

[56] References Cited

U.S. PATENT DOCUMENTS

| 4,336,320 | 6/1982 | Cummings et al. | 430/198 |
|---|---|---|---|
| 4,750,070 | 6/1988 | Maruyama | 360/113 |
| 5,489,551 | 2/1996 | Castleberry | 437/173 |
| 5,602,060 | 2/1997 | Kobayashi et al. | 437/238 |
| 5,693,566 | 12/1997 | Cheung | 437/195 |

*Primary Examiner*—Sara Crane
*Attorney, Agent, or Firm*—Bret J. Petersen; William B. Kempler; Richard L. Donaldson

[57] ABSTRACT

A low capacitance interconnect structure and process is provided for integrating low-k decomposed polymers into integrated circuit structures and processes, especially those requiring multiple levels of interconnect lines, for reduced capacitance over prior art structures. Embodiments of the present invention use polymers which typically decompose into gases with lower dielectric coefficients than the original polymer to provide a lower dielectric constant material between conductive interconnects on an integrated circuit. The materials are decomposed after being sealed in with a cap layer to prevent contamination of the gas filled void left after decomposition. The present invention also combines the advantages of $SiO_2$ with low dielectric decomposed polymers by placing the low decomposed material only between tightly spaced lines. The low-k polymer material can be applied by spin-on techniques or by vapor deposition.

11 Claims, 3 Drawing Sheets

LOW CAPACITANCE INTERCONNECT STRUCTURE FOR INTEGRATED CIRCUITS USING DECOMPOSED POLYMERS

CROSS-REFERENCES TO RELATED APPLICATIONS

The following co-assigned previously filed applications are related to the instant application and are incorporated herein by reference.

| Application | TI Case | Filing Date | Title |
| --- | --- | --- | --- |
| S/N 60/005132 | TI-20784 | 10/12/95 | A Low Capacitance Interconnect Structure For Integrated Circuits |
| S/N 08/137,658 | TI-18509 | 10/15/93 | Planarized Structure for Line-Line Capacitance Reduction |
| S/N 08/298,807 | TI-19532 | 08/03/94 | Improving Interconnect Capacitance Between Metal Leads |
| S/N 08/455,765 | TI-18929AA | 05/31/95 | A Planarized Multi-Level Interconnect Scheme With Embedded Low-Dielectric Constant Insulators |

FIELD OF THE INVENTION

This invention generally relates to interconnections in integrated circuits. More particularly, it relates to a method of manufacture and a structure for reducing capacitance on closely spaced interconnect lines of an integrated circuit.

BACKGROUND OF THE INVENTION

Integrated circuits have continued to shrink in size and increase in complexity with each new generation of devices. As a result, integrated circuits increasingly require very close spacing of interconnect lines and many now require multiple levels of metalization, as many as five, to interconnect the various circuits on the device. Since closer spacing increases capacitance between adjacent lines, as the device geometries shrink and densities increase capacitance and cross talk between adjacent lines becomes more of a problem. Therefore, it becomes increasingly more desirable to use materials with lower dielectric constants to offset this trend and thereby lower capacitance between closely spaced interconnects.

Interconnect capacitance has two components: the line-to-substrate, or line-to-ground capacitance and line-to-line capacitance. For ultra large scale integration at 0.25 micron design rules and beyond, performance is dominated by interconnect RC delay, with line-to-line capacitance being the dominant contributor to total capacitance. For example, theoretical modeling has shown that when the width/spacing is scaled down below 0.3 micron, the interlayer capacitance is so small that total capacitance is dictated by the line-to-line capacitance, which constitutes more than 90% of the total interconnect capacitance. Therefore, a reduction of the line-line capacitance alone will provide a dramatic reduction in total capacitance.

The intermetal dielectric (IMD) of the prior art is typically $SiO_2$ which has a dielectric constant of about 4.0 or higher. It would be desirable to replace this material with a material having a lower dielectric constant. As used herein, low dielectric constant or low-k means a material having a dielectric constant of lower than 4 and preferably lower than 3 and most preferably about 2 or lower. Unfortunately, materials having a lower dielectric constant have characteristics that make them difficult to integrate into existing integrated circuit structures and processes. Many polymeric materials such as polysilsesquioxane, parylene, polyimide, benzocyclobutene and amorphous Teflon have lower dielectric constants (lower permitivities). Other preferred materials are Aerogel or Xerogel which are typically made from a gelation of tetraethyl orthosilicate stock solution. Compared to $SiO_2$, these preferred low-k materials typically have low mechanical strength, poor dimensional stability, poor temperature stability, high moisture absorption and permeation, poor adhesion, large thermal expansion coefficient and an unstable stress level. Because of these attributes, the use of polymer or other low dielectric materials as a stand alone replacement for $SiO_2$ in integrated circuit processes or structures is very difficult if not impossible.

SUMMARY OF THE INVENTION

In accordance with the present invention, a method and structure is provided for integrating decomposed materials into integrated circuits for reduced capacitance, especially those requiring multiple levels of interconnect lines. Embodiments of the present invention use polymers which typically thermally decompose into gases with lower dielectric coefficients than the original polymer to provide a lower dielectric constant material between conductive interconnects on an integrated circuit.

Embodiments of the present invention also combine the advantages of $SiO_2$ for an intermetal dielectric with low dielectric constant materials formed by decomposition by placing the low dielectric material only in critical areas, between those tightly spaced lines where capacitance is a problem. Since the interlayer dielectric is still mostly comprised of a traditional dielectric such as $SiO_2$, many of the problems discussed above are alleviated. Structural stability, adhesion, thermal conductivity etc. are provided by the $SiO_2$ or other suitable dielectric.

In an embodiment of the present invention, interconnect lines are first patterned and etched. A polymer such as parylene is deposited over the substrate to fill the areas between interconnect lines. The polymer material in preferably masked in critical areas and polymer in non-critical and/or widely spaced areas is then etched away, leaving the polymer material in those areas where it is needed. A cap layer is then applied to seal the low-k polymer material in the critical areas. The polymer is then decomposed to reduce it's dielectric constant. An intermetal dielectric layer such as $SiO_2$ can then be applied to fill the remaining areas and provide spacing between metal layers. After planarization of the $SiO_2$, the process steps can be repeated for multiple interconnect layers.

This is apparently the first use of a low-k gas formed by decomposition of materials such as parylene between narrowly spaced lines in critical areas of device interconnects.

An advantage for an embodiment of this invention is the decomposition to form voids filled with a low-k gas, where formation of the voids can be done subsequent to enclosing the areas with a cap layer to prevent contamination of the void area.

An additional advantage of this invention is the use of standard interconnect processes such as metal etch, via etch and metal plug formation.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
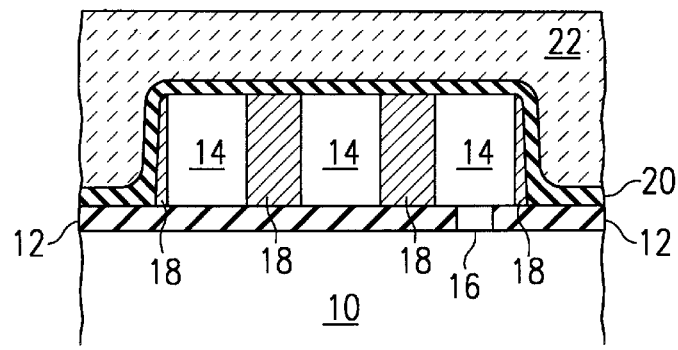
FIG. 1 Represents a cross-sectional view of a preferred embodiment of the present invention.

The preferred embodiments of the present invention are best understood by referring to FIGS. 1–3 of the drawings, like numerals are used for like and corresponding parts of the various drawings.

With reference to FIG. 1, there is shown an embodiment of the present invention, wherein a decomposed low-k material 18 is deposited between interconnect lines 14 on a semiconductor substrate 10. The low-k material may be applied by one of several methods known in the art and by those listed in the above referenced applications. A cap layer 20 covers the low-k material and prevents contamination of the area by subsequent processes. Above the cap layer 20 is a planarized interlayer dielectric. The structure may then be repeated for multi-level interconnects.

Figure 2A:
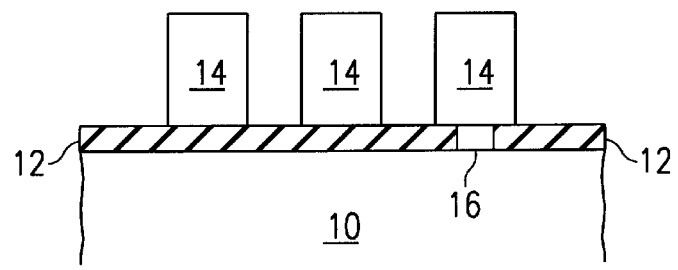
FIGS. 2a–2e Shows the steps to fabricate the preferred embodiment of FIG. 1.

With reference to FIGS. 2a–2e, there is shown a sequence of steps for forming an embodiment of the present invention which is represented by the completed structure shown in FIG. 1. FIG. 2a illustrates a semiconductor substrate 10 covered with a layer of dielectric 12. The illustrated embodiment of the present invention is directed to reducing capacitance between interconnections on an integrated circuit. Since these interconnections are typically located over the top of active devices fabricated on the surface of a wafer of semiconducting material such as silicon crystal, semiconductor substrate 10 will normally include several layers of various semiconductor materials which make up the active components of the semiconductor device. For simplicity, these layers and devices are not shown in the illustrations. Dielectric layer 12 may be any material suitable for insulating metal interconnect lines 14 from components or other materials in layers below and shown lumped together as semiconductor substrate 10.

Interconnect lines are preferably formed by depositing a layer of aluminum on a preferably planer dielectric layer 12. The aluminum may be masked with a resist, patterned and etched with one of several methods known in the art. This procedure results in the metal connecting lines 14 as shown in FIG. 2a. The method of the present invention contemplates using high aspect ratio metal, where the thickness of the interconnect metal is greater than the width. The high aspect ratio interconnects are useful to reduce line resistance while maintaining close spacing for high density circuits. Connection between the interconnects and the circuits below is represented by the via and plug 16. The number and location of vias is determined by the underlying circuit design.

Figure 2B:
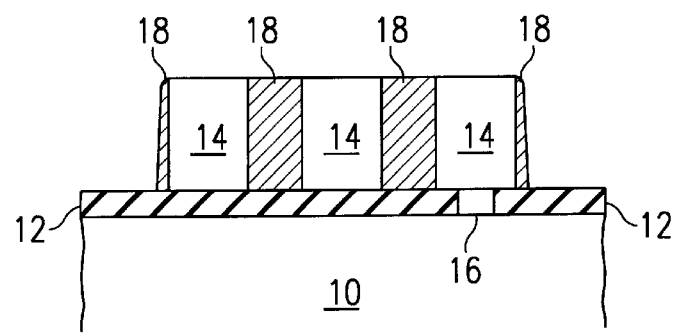
Figure 2C:
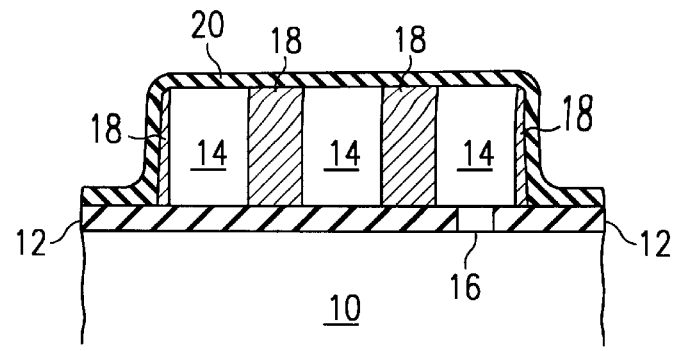

FIG. 2b shows the application of a low dielectric constant polymer material 18 applied between the interconnects 14 on the surface of the wafer. The polymer material 18 is applied in sufficient thickness to fill critical areas between the metal interconnects 14, shown in FIG. 2b. In a preferred embodiment, the low-k material is applied by vapor deposition and then etched back to result in the structure shown in FIG. 2b. The vapor deposition of polymers and subsequent etch back is disclosed in Ser. No. 08/455,765 (TI-18929AA) by applicant herein. The preferred materials are those listed in the table below, which have a dielectric constant of less than about 3, while the most preferred are polymer materials such as parylene-C and fluoropolymers. These most preferred materials have a decomposition temperature below 400° C.

After application of the polymer material 18, the polymer material is preferably caped with a cap layer 20. The cap layer is preferably $SiO_2$ having high Si-OH concentration which is preferably applied by chemical vapor deposition or spin-on coating about 200 Å in thickness. The Si-OH concentration aids in the adhesion of the subsequent $SiO_2$ plasma layer.

Figure 2D:
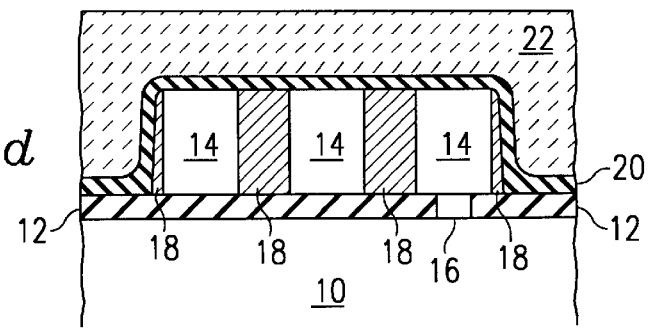

The cap layer is preferably followed by a thick, about 16,000 Å, $SiO_2$ interlayer dielectric for planarization. After planarization of the interlayer dielectric, the structure is as shown in FIG. 2d. In a preferred embodiment, the interlayer dielectric is $SiO_2$ deposited by plasma enhanced chemical vapor deposition (PECVD) and planarized by chemical mechanical polishing (CMP). As further discussed below, the present invention combines the advantages of $SiO_2$ and low dielectric constant materials by placing the low dielectric material only between tightly spaced lines or critical areas. Since the interlayer dielectric is still mostly comprised of a traditional dielectric such as $SiO_2$, many of the problems discussed above are alleviated. Structural stability, adhesion, thermal conductivity etc. are provided by the $SiO_2$ or other suitable dielectric.

In the preferred embodiment illustrated by FIG. 2 the low-k polymer material 18 is decomposed after planarization of the interlayer dielectric. In a preferred embodiment, parylene decomposes into molecules such as parylene monomers at temperatures higher than 400° C. or smaller molecules like $CH_4$ and benzene at even higher temperatures. The decomposed gases may remain in the enclosed area or will begin to diffuse through the cap layer and interlayer dielectric. The decomposed polymer gases may continue to diffuse out of the enclosed area as the device remains at elevated temperatures. It may be beneficial to keep the device at higher temperatures after decomposition to more of the gases to escape or distribute inside the $SiO_2$ to prevent excessive pressure buildup in subsequent processes. Decomposing the low-k polymer material 18 further reduces the dielectric constant of the low-k polymer material. For parylene, experiment has shown that the decomposition reduces the capacitance by 10–15%. Decomposition is a function of temperature and the time where the polymers decompose faster at higher temperatures. In a preferred embodiment, the device is heated in a furnace or on a wafer chuck at 450° C. for about 1 hour. This normally results in 100% decomposition of the polymer.

Figure 2E:
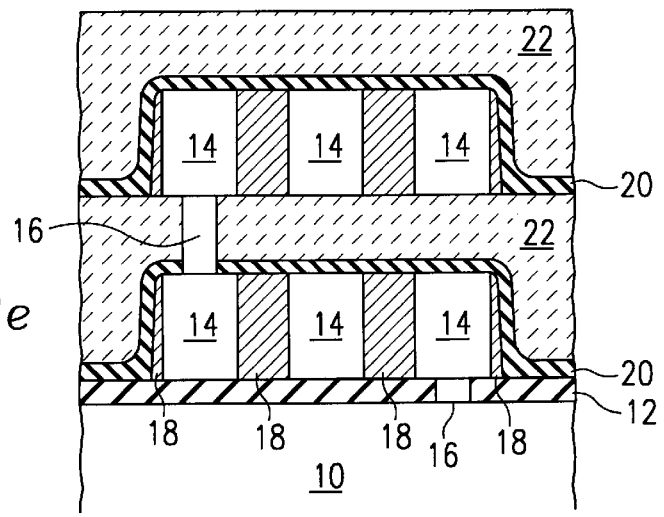

The method of the present invention may be repeated to form multiple levels of interconnects stacked one upon the other. An example of multiple levels is shown in FIG. 2e. Typically multiple level interconnects will necessitate vias 16 and contacts from one level to the next. These vias are usually made after the interlevel dielectric has been applied and planarized in a manner well known in the art.

Figure 3A:
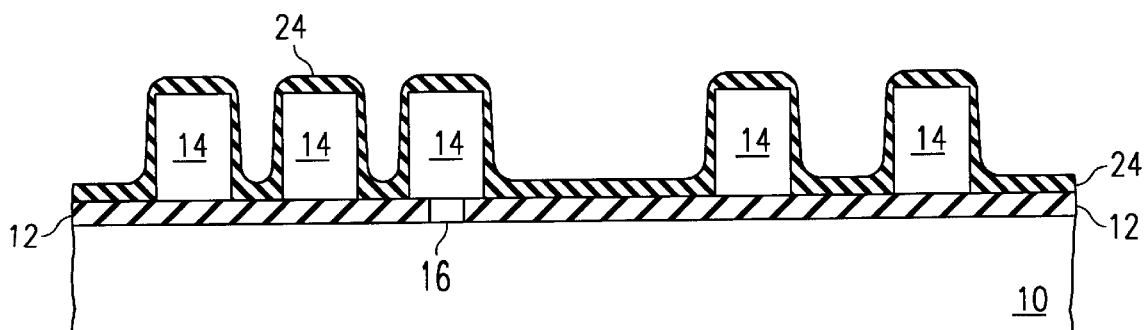
FIGS. 3a–3e Represents a cross-sectional view of another preferred embodiment of the present invention.
Figure 3B:
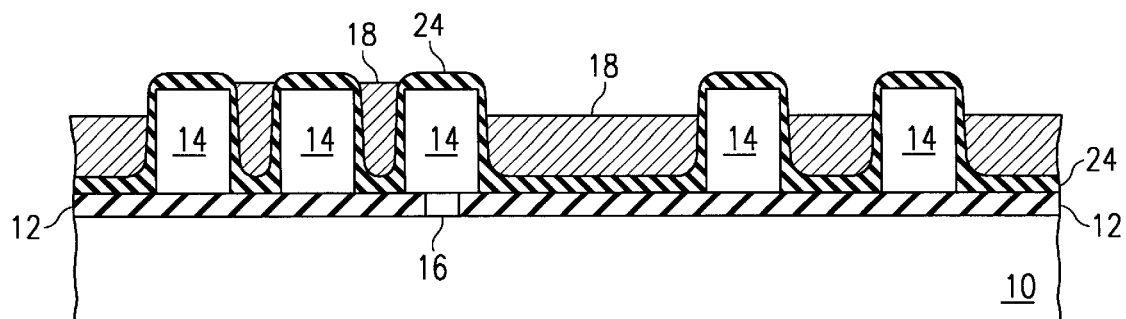
Figure 3C:
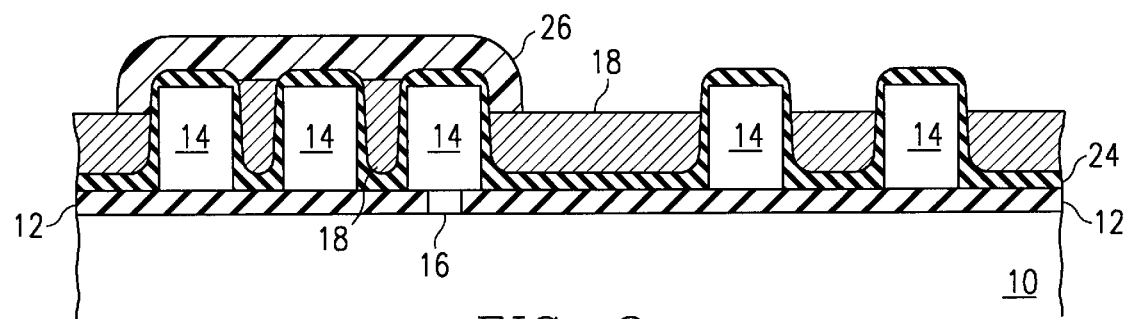
Figure 3D:
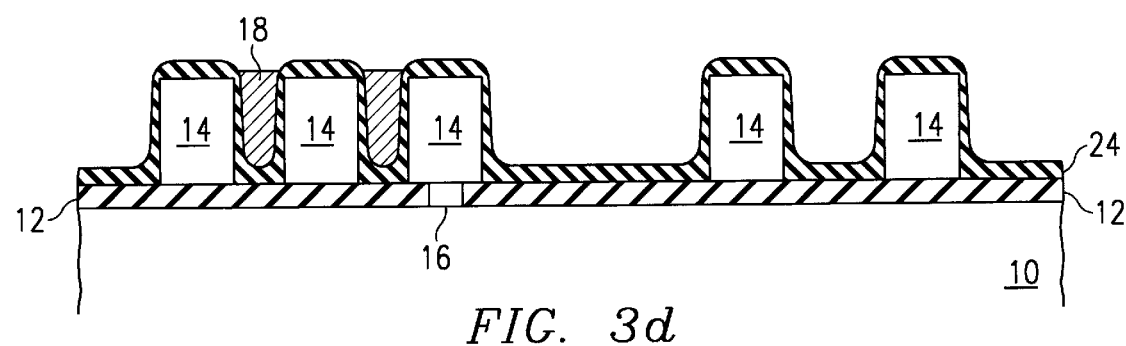
Figure 3E:
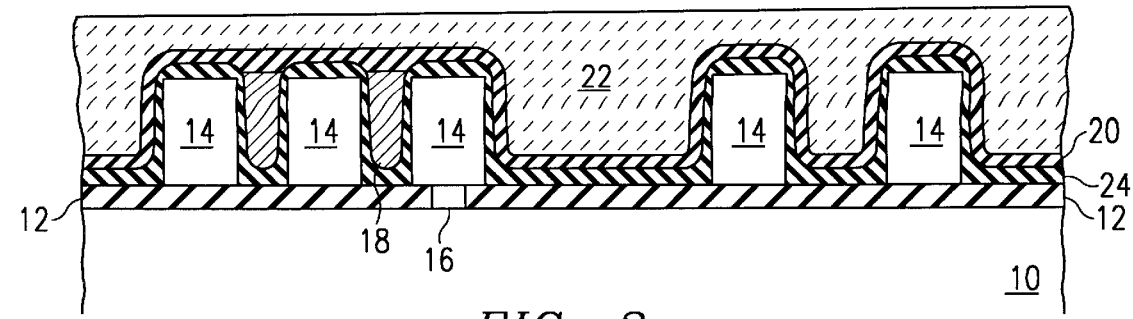

The present invention also contemplates using decomposed polymers in combination with the structures and techniques disclosed in the previous co-assigned applications listed above. In particular, Ser. No. 60/005,132 (TI20784) by applicant herein, disclosed a structure for applying low-k materials in selected critical areas while non-critical or widely spaced areas are filled with a conventional dielectric to give mechanical and thermal stability, adhesion, etc. As used herein, "critical areas" are those areas where capacitance is a problem or where it is desirable to decrease the capacitance between two adjacent metal leads or interconnects. Capacitance is typically a problem where a combination of close spacing of interconnect lines and the relative high frequency of signals on those interconnect lines lead to crosstalk, signal degradation or increased drive requirements. Thus, at low frequencies a minimum lead spacing, which is the minimum spacing allowed by the process design rules, may not be critical; but at higher frequencies that same spacing becomes critical since the interconnect RC delay time becomes the limiting factor for device performance. Critical areas are therefore dependant on design consideration such as frequency of the signals, minimum design rules, tolerance to capacitance etc. Non-critical areas need not be filled, and preferably are not filled with low-k material. FIG. 3d, further discussed below represents a preferred embodiment after the low-k material 18 is etched from the non-critical areas and the resist 26 has been removed. Etching of the low-k material can be done with either dry or wet etch processes known in the art.

In another preferred embodiment, the low-k material is applied by the spin-on method. In the spin-on method the low-k polymer material is dropped in a liquid form onto the spinning wafer (substrate) and the material disperses across the wafer. In this embodiment of the present invention, the methods of Ser. No. 60/005,132 (TI-20784) may be used to place the low-k polymer material between closely spaced interconnects in critical areas. FIG. 3a–e illustrates the steps of this method and structure. FIG. 3a shows a substrate 10 having interconnects formed thereon as discussed above for the previous embodiment. FIG. 3a also shows a liner layer 24. The use of a liner layer 24 is optional depending upon whether the low-k dielectric can be directly applied on the interconnects 14. The liner layer may be an etch stopping layer such as a low-dielectric organic spin-on-glass or silicon oxide. A low-k polymer film is then spun onto the surface of the wafer. Spin-on application typically results in the material being deposited with a varying thickness across the wafer. The thickness of the material usually will be thicker in areas where the width of the gap is narrow as shown in FIG. 3b. The preferred materials are those listed in the table below, which have a dielectric constant of less than about 3, while the most preferred materials are fluoropolymers. Fluoropolymer has a decomposition temperature below 400° C. and a dielectric constant about 2 or below. Critical areas are then masked 26 as shown in FIG. 3c, and the low-k material in non-critical areas is preferable etched away as shown in FIG. 3d. The cap layer 20 may then be applied as discussed above and shown in FIG. 3e. The structure may then be heated to decompose the polymer as discussed above (or decomposition may be performed after all layers of metal are complete). An interdielectric 22 is then preferably applied and planarized as discussed above and shown in FIG. 3e.

The sole Table, below, provides an overview of some embodiments and the drawings.

TABLE

| Drawing Element | Preferred or Specific Examples | Generic Term | Other Alternate Examples |
|---|---|---|---|
| 10 | Silicon Substrate | Substrate or Wafer | GaAs |
| 12 | Silicon Oxide | Buffer Layer | |
| 14 | Aluminum | Interconnect Line | TiN/A1/TiN, Cu |
| 16 | Tungsten | Via | Aluminum |
| 18 | Polymer/ Decomposed Polymer | Low Dielectric Constant Material | Parylene-C, Parylene-N, Teflon, Polyimide, Fluorinated polyimide, Benzocyclobutene, Fluorinated benzocyclobutene. |
| 20 | Silicon Oxide | Cap Layer | |
| 22 | $SiO_2$ | Intermetal Dielectric | Fluorivated $SiO_2$, Diamond, or other dielectrics with good mechanical strength. |
| 24 | Silicon Oxide | Liner | |
| 26 | Photoresist | Mask | |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic structure comprising:
   (a) a semiconductor substrate;
   (b) a dielectric layer on said semiconductor substrate;
   (c) a plurality of interconnects on said dielectric layer on said semiconductor substrate; and
   (d) a decomposed dielectric material comprising compounds formed from decomposing a dielectric, wherein the compounds include at least one gas, between at least two of said interconnects.

2. The structure according to claim 1, further comprising a cap layer above said decomposed dielectric between said interconnects.

3. The structure of claim 1, wherein said dielectric used to obtain said compounds between said at least two interconnects is a polymer selected from the group consisting of:

Polyimide, Polysilsesquioxane, Benzocyclobutene, Parylene C, Parylene N, Florinated polyimide, Parylene F, Poly-naphthalene, Amorphous Telflon, Polymer foams, Aerogel, Xerogel.

4. The structure of claim 1 further comprising an interlayer dielectric layer formed over said decomposed dielectric layer and said interconnects.

5. The structure of claim 1 further comprising a liner layer between at least two of said interconnects and said decomposed dielectric.

6. A microelectronic structure comprising:
   (b) a semiconductor substrate;
   (b) a dielectric layer on said semiconductor substrate;
   (c) a plurality of interconnects on said dielectric layer on said semiconductor substrate;
   (c) a decomposed dielectric material comprising compounds formed from decomposing a dielectric, wherein said compounds include at least one gas, where said decomposed dieletric material is laterally between at least two of said interconnects which are closely spaced; and
   (d) a cap layer over said decomposed dielectric and said interconnects.

7. The structure of claim 6, wherein said dielectric used to obtain said compounds between said at least two interconnects is a polymer selected from the group consisting of: Polyimide, Polysilsesquioxane, Benzocyclobutene, Parylene C, Parylene N, Florinated polyimide, Parylene F, Poly-naphthalene, Amorphous Telflon, Polymer foams, Aerogel, Xerogel.

8. The structure of claim 7 further comprising an interlayer dielectric layer formed on said cap layer over said interconnects.

9. The structure of claim 8 further comprising a liner layer between at least two of said interconnects and said decomposed dielectric.

10. A microelectronic structure comprising:
    (a) a semiconductor substrate;
    (b) a dielectric layer on said semiconductor substrate;
    (c) a plurality of interconnects on said dielectric layer on said semiconductor substrate;
    (d) a decomposed dielectric material, comprising compounds formed from decomposing a dielectric, lying laterally between at least two of said interconnects which are closely spaced but not vertically between two adjacent levels of interconnect;
    (e) a cap layer over said decomposed dielectric and said interconnects; and
    (f) an interlayer dielectric layer formed on said cap layer over said interconnects.

11. The structure of claim 10, wherein said dielectric used to obtain said compounds between said at least two interconnects is a polymer selected from the group consisting of: Polyimide, Polysilsesquioxane, Benzocyclobutene, Parylene C, Parylene N, Florinated polyimide, Parylene F, Poly-naphthalene, Amorphous Telflon, Polymer foams, Aerogel, Xerogel.

* * * * *